(12) United States Patent
Hung et al.

(10) Patent No.: US 12,183,798 B2
(45) Date of Patent: Dec. 31, 2024

(54) THRESHOLD VOLTAGE MODULATION FOR GATE-ALL-AROUND FET ARCHITECTURE

(71) Applicant: Applied Materials, Inc., Santa Clara, CA (US)

(72) Inventors: Steven C. H. Hung, Sunnyvale, CA (US); Benjamin Colombeau, Salem, MA (US); Myungsun Kim, Pleasanton, CA (US); Srinivas Gandikota, Santa Clara, CA (US); Yixiong Yang, San Jose, CA (US); Jacqueline Samantha Wrench, Santa Clara, CA (US); Yong Yang, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 500 days.

(21) Appl. No.: 17/528,863

(22) Filed: Nov. 17, 2021

(65) Prior Publication Data

US 2022/0238680 A1    Jul. 28, 2022

Related U.S. Application Data

(60) Provisional application No. 63/141,276, filed on Jan. 25, 2021.

(51) Int. Cl.
*H01L 29/423*    (2006.01)
*H01L 29/06*    (2006.01)
*H01L 29/78*    (2006.01)
*H01L 29/786*    (2006.01)

(52) U.S. Cl.
CPC .... *H01L 29/42392* (2013.01); *H01L 29/0673* (2013.01); *H01L 29/7856* (2013.01); *H01L 29/78696* (2013.01)

(58) Field of Classification Search
CPC ........... H01L 29/42392; H01L 29/0673; H01L 29/7856; H01L 21/28185; H01L 29/78696; H01L 21/28202; H01L 21/28079
See application file for complete search history.

(56) References Cited

U.S. PATENT DOCUMENTS

| | | | |
|---|---|---|---|
| 7,431,795 B2 | 10/2008 | Kumar et al. | |
| 8,993,058 B2 | 3/2015 | Anthis et al. | |
| 9,214,377 B2 | 12/2015 | Zhang et al. | |
| 9,484,406 B1 | 11/2016 | Sun et al. | |
| 2011/0298060 A1 | 12/2011 | Chen et al. | |
| 2016/0315164 A1 | 10/2016 | Son et al. | |
| 2019/0348530 A1 | 11/2019 | Ando et al. | |
| 2019/0371903 A1* | 12/2019 | Bao | H01L 21/28185 |
| 2020/0373300 A1 | 11/2020 | Zhang et al. | |
| 2021/0391225 A1* | 12/2021 | Cheng | H01L 29/517 |

OTHER PUBLICATIONS

PCT Intl Application No. PCT/US2021/059779 International Search Report and Written Opinion dated Mar. 14, 2022.

* cited by examiner

*Primary Examiner* — Changhyun Yi
(74) *Attorney, Agent, or Firm* — Patterson + Sheridan, LLP

(57) ABSTRACT

A method of forming a gate stack structure includes forming a dipole metal layer on a high-κ gate dielectric layer on a semiconductor structure formed on a substrate, annealing the dipole metal layer, and removing the dipole metal layer. The dipole metal layer comprises dopants in the high-κ gate dielectric layer.

20 Claims, 8 Drawing Sheets

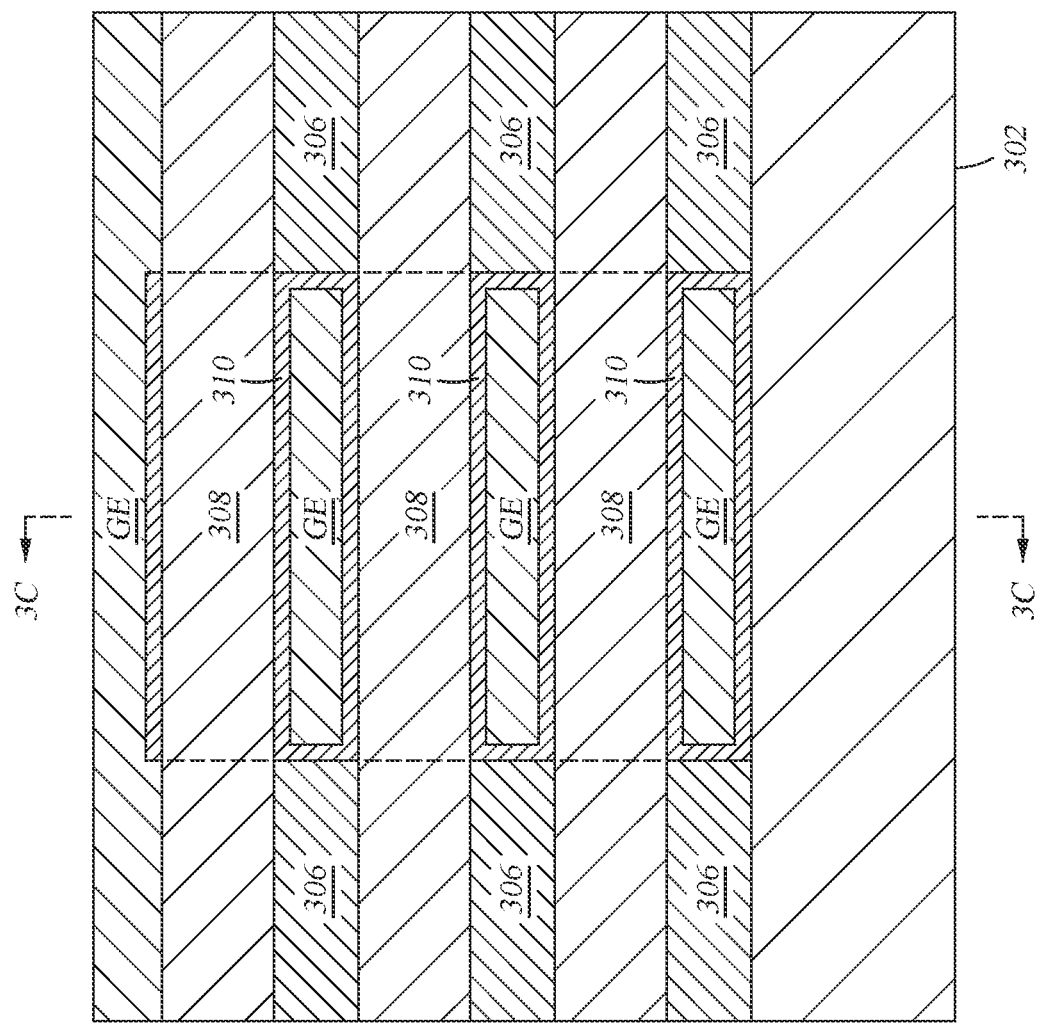

Fig. 4B

| 314 |
|-----|
| 312 |
| 308 |

Fig. 4D

| 316 |
|-----|
| 314 |
| 312 |
| 308 |

Fig. 4A

| 312 |
|-----|
| 308 |

Fig. 4C

| 316 |
|-----|
| 314 |
| 312 |
| 308 |

Fig. 3D

| GE |
|-----|
| 322 |
| 320 |
| 318 |
| 316 |
| 314 |
| 312 |
| 308 |

310 (bracket encompassing 322 through 312)

THRESHOLD VOLTAGE MODULATION FOR GATE-ALL-AROUND FET ARCHITECTURE

CROSS-REFERENCE TO RELATED APPLICATIONS

This application claims priority to U.S. Provisional Patent Application Ser. No. 63/141,276, filed on Jan. 25, 2021, which herein is incorporated by reference.

BACKGROUND

Field

Embodiments described herein generally relate to semiconductor device fabrication, and more particularly, to systems and methods of forming a gate stack structure in a gate-all-around field-effect transistor (FET).

Description of the Related Art

Multiple threshold voltage $V_t$ (multi-$V_t$) techniques are commonly employed to optimize for power, timing, and area constraints in metal-oxide-semiconductor field-effect transistors (MOSFETs). Low threshold voltage $V_t$ (low-$V_t$) modules switch more quickly in response to input signals, but consume more leakage power. High threshold voltage $V_t$ (high-$V_t$) modules switch more slowly, but consume less leakage power. In a typical power optimization design, low-$V_t$ modules and high-$V_t$ modules are mixed to meet speed and area constraints with the lowest power dissipation.

The threshold voltages $V_t$ in MOSFETs are conventionally modulated by inserting an interface dipole layer in a high-κ/metal gate stack or adding a work function adjusting layer to a gate electrode. However, the conventional $V_t$ modulation methods may be incompatible with architectures for the sub 10-15 nm technology nodes, such as gate-all-around FET (GAA FETs) in which a gate is placed on all four sides of a channel.

Thus, there is a need for systems and methods that can fabricate newer and smaller FET devices with modulated threshold voltages $V_t$.

SUMMARY

Embodiments of the present disclosure provide a method of forming a gate stack structure. The method includes forming a dipole metal layer on a high-κ gate dielectric layer on a semiconductor structure formed on a substrate, annealing the dipole metal layer, and removing the dipole metal layer. The dipole metal layer comprises dopants in the high-κ gate dielectric layer.

Embodiments of the present disclosure also provide a method of forming a gate stack structure. The method includes forming a p-type work function adjusting layer on a high-κ gate dielectric layer on a semiconductor structure formed on a substrate, forming an n-type work function adjusting layer on the high-κ gate dielectric layer, and forming a metal gate electrode on the p-type work function adjusting layer and the n-type work function adjusting layer. The p-type work function adjusting layer comprises p-doped conductive material, and the n-type work function adjusting layer comprises n-doped conductive material.

Embodiments of the present disclosure further provide a method of forming a gate stack structure on a semiconductor structure. The method includes forming an interfacial layer on a semiconductor structure, forming a high-κ gate dielectric layer on the interfacial layer, forming a dipole metal layer comprising dopants in the high-κ gate dielectric layer on the high-κ gate dielectric layer, annealing the dipole metal layer, removing the dipole metal layer, forming a first high-κ dielectric cap layer on the high-κ gate dielectric layer, forming a p-type work function adjusting layer on the high-κ gate dielectric layer, forming an n-type work function adjusting layer on the high-κ gate dielectric layer, forming a second high-κ dielectric cap layer on the p-type work function adjusting layer and the n-type work function adjusting layer, and forming a metal gate electrode on the second high-κ dielectric cap layer. The p-type work function adjusting layer comprises p-doped conductive material, and the n-type work function adjusting layer comprises n-doped conductive material.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 3B, 3C, and 3D are cross-sectional views of a portion of a semiconductor structure according to one embodiment.

FIGS. 4A, 4B, 4C, 4D, 4E, 4F, 4G, and 4H are cross-sectional views of a portion of a gate stack structure according to one embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The embodiments described herein provide systems and methods for forming transistor devices for extremely scaled process nodes, such as gate-all-around (GAA) FET with modulated threshold voltages $V_t$. In such devices, a high-κ dielectric material (e.g., hafnium oxide ($HfO_2$)) is used as a gate dielectric, instead of the traditional silicon dioxide ($SiO_2$) gate dielectric, and a metal layer (e.g., titanium (Ti), tantalum (Ta), tungsten (W)), or a conductive compound layer (e.g., titanium nitride (TiN), tantalum nitride (TaN)) is used as a gate electrode, instead of the conventional polycrystalline silicon (polysilicon) gates. The threshold voltages $V_t$ are modulated by inducing a dipole layer in the high-κ gate dielectric, adding a work function adjusting layer to the gate electrode, and adjusting thickness thereof, or combinations thereof.

Figure 1:
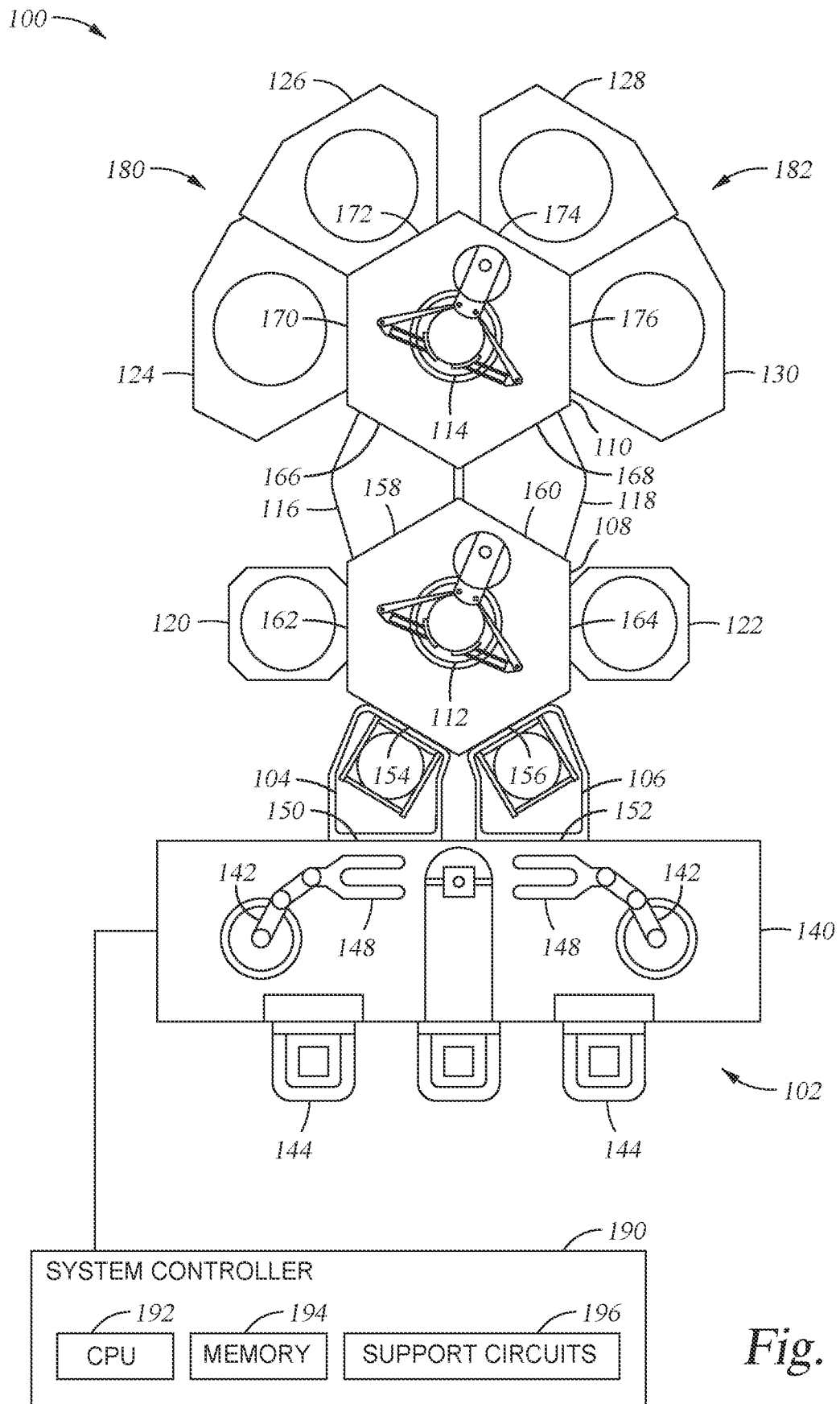
FIG. 1 is a schematic top-view diagram of an example multi-chamber processing system according to one embodiment.

FIG. 1 is a schematic top-view diagram of an example of a multi-chamber processing system 100 according to some examples of the present disclosure. The processing system 100 generally includes a factory interface 102, load lock chambers 104, 106, transfer chambers 108, 110 with respective transfer robots 112, 114, holding chambers 116, 118, and processing chambers 120, 122, 124, 126, 128, 130. As detailed herein, wafers in the processing system 100 can be processed in and transferred between the various chambers without exposing the wafers to an ambient environment exterior to the processing system 100 (e.g., an atmospheric ambient environment such as may be present in a fab). For example, the wafers can be processed in and transferred between the various chambers in a low pressure (e.g., less than or equal to about 300 Torr) or vacuum environment without breaking the low pressure or vacuum environment between various processes performed on the wafers in the processing system 100. Accordingly, the processing system 100 may provide for an integrated solution for some processing of wafers.

Examples of a processing system that may be suitably modified in accordance with the teachings provided herein include the Endura®, Producer® or Centura® integrated processing systems or other suitable processing systems commercially available from Applied Materials, Inc., located in Santa Clara, California. It is contemplated that other processing systems (including those from other manufacturers) may be adapted to benefit from aspects described herein.

In the illustrated example of FIG. 1, the factory interface 102 includes a docking station 140 and factory interface robots 142 to facilitate transfer of wafers. The docking station 140 is configured to accept one or more front opening unified pods (FOUPs) 144. In some examples, each factory interface robot 142 generally comprises a blade 148 disposed on one end of the respective factory interface robot 142 configured to transfer the wafers from the factory interface 102 to the load lock chambers 104, 106.

The load lock chambers 104, 106 have respective ports 150, 152 coupled to the factory interface 102 and respective ports 154, 156 coupled to the transfer chamber 108. The transfer chamber 108 further has respective ports 158, 160 coupled to the holding chambers 116, 118 and respective ports 162, 164 coupled to processing chambers 120, 122. Similarly, the transfer chamber 110 has respective ports 166, 168 coupled to the holding chambers 116, 118 and respective ports 170, 172, 174, 176 coupled to processing chambers 124, 126, 128, 130. The ports 154, 156, 158, 160, 162, 164, 166, 168, 170, 172, 174, 176 can be, for example, slit valve openings with slit valves for passing wafers therethrough by the transfer robots 112, 114 and for providing a seal between respective chambers to prevent a gas from passing between the respective chambers. Generally, any port is open for transferring a wafer therethrough. Otherwise, the port is closed.

The load lock chambers 104, 106, transfer chambers 108, 110, holding chambers 116, 118, and processing chambers 120, 122, 124, 126, 128, 130 may be fluidly coupled to a gas and pressure control system (not specifically illustrated). The gas and pressure control system can include one or more gas pumps (e.g., turbo pumps, cryo-pumps, roughing pumps), gas sources, various valves, and conduits fluidly coupled to the various chambers. In operation, a factory interface robot 142 transfers a wafer from a FOUP 144 through a port 150 or 152 to a load lock chamber 104 or 106. The gas and pressure control system then pumps down the load lock chamber 104 or 106. The gas and pressure control system further maintains the transfer chambers 108, 110 and holding chambers 116, 118 with an interior low pressure or vacuum environment (which may include an inert gas). Hence, the pumping down of the load lock chamber 104 or 106 facilitates passing the wafer between, for example, the atmospheric environment of the factory interface 102 and the low pressure or vacuum environment of the transfer chamber 108.

With the wafer in the load lock chamber 104 or 106 that has been pumped down, the transfer robot 112 transfers the wafer from the load lock chamber 104 or 106 into the transfer chamber 108 through the port 154 or 156. The transfer robot 112 is then capable of transferring the wafer to and/or between any of the processing chambers 120, 122 through the respective ports 162, 164 for processing and the holding chambers 116, 118 through the respective ports 158, 160 for holding to await further transfer. Similarly, the transfer robot 114 is capable of accessing the wafer in the holding chamber 116 or 118 through the port 166 or 168 and is capable of transferring the wafer to and/or between any of the processing chambers 124, 126, 128, 130 through the respective ports 170, 172, 174, 176 for processing and the holding chambers 116, 118 through the respective ports 166, 168 for holding to await further transfer. The transfer and holding of the wafer within and among the various chambers can be in the low pressure or vacuum environment provided by the gas and pressure control system.

The processing chambers 120, 122, 124, 126, 128, 130 can be any appropriate chamber for processing a wafer. In some examples, the processing chamber 122 can be capable of performing a cleaning process, the processing chamber 120 can be capable of performing an etch process, and the processing chambers 124, 126, 128, 130 can be capable of performing respective epitaxial growth processes. The processing chamber 122 may be a SiCoNi™ Preclean chamber available from Applied Materials of Santa Clara, Calif. The processing chamber 120 may be a Selectra™ Etch chamber available from Applied Materials of Santa Clara, Calif.

A system controller 190 is coupled to the processing system 100 for controlling the processing system 100 or components thereof. For example, the system controller 190 may control the operation of the processing system 100 using a direct control of the chambers 104, 106, 108, 116, 118, 110, 120, 122, 124, 126, 128, 130 of the processing system 100 or by controlling controllers associated with the chambers 104, 106, 108, 116, 118, 110, 120, 122, 124, 126, 128, 130. In operation, the system controller 190 enables data collection and feedback from the respective chambers to coordinate performance of the processing system 100.

The system controller 190 generally includes a central processing unit (CPU) 192, memory 194, and support circuits 196. The CPU 192 may be one of any form of a general purpose processor that can be used in an industrial setting. The memory 194, or non-transitory computer-readable medium, is accessible by the CPU 192 and may be one or more of memory such as random access memory (RAM), read only memory (ROM), floppy disk, hard disk, or any other form of digital storage, local or remote. The support circuits 196 are coupled to the CPU 192 and may comprise cache, clock circuits, input/output subsystems, power supplies, and the like. The various methods disclosed herein may generally be implemented under the control of the CPU 192 by the CPU 192 executing computer instruction code stored in the memory 194 (or in memory of a particular process chamber) as, for example, a software routine. When the computer instruction code is executed by the CPU 192, the CPU 192 controls the chambers to perform processes in accordance with the various methods.

Other processing systems can be in other configurations. For example, more or fewer processing chambers may be coupled to a transfer apparatus. In the illustrated example, the transfer apparatus includes the transfer chambers 108, 110 and the holding chambers 116, 118. In other examples, more or fewer transfer chambers (e.g., one transfer chamber) and/or more or fewer holding chambers (e.g., no holding chambers) may be implemented as a transfer apparatus in a processing system.

Figure 2A:
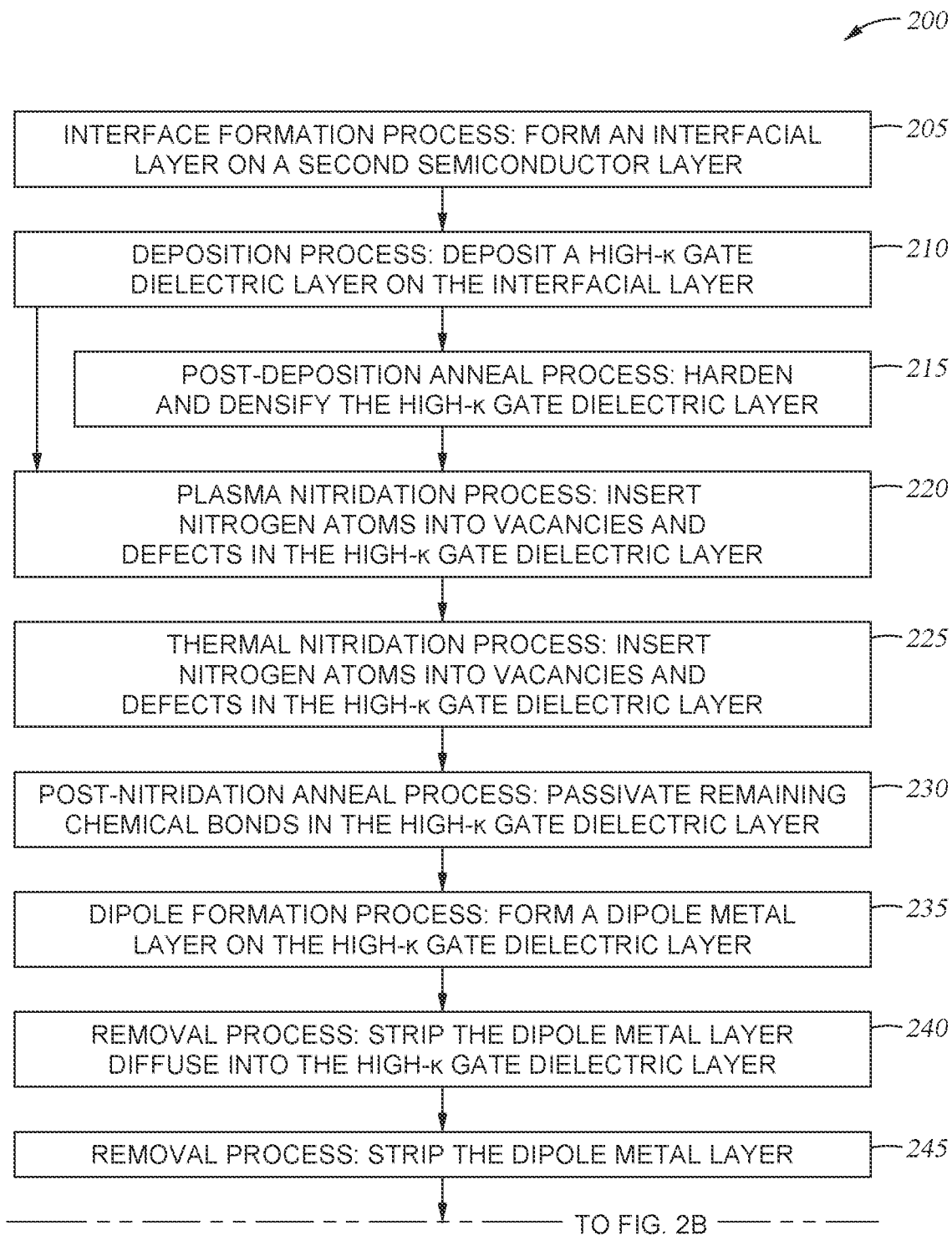
FIGS. 2A and 2B depict a process flow diagram of a method of forming a semiconductor structure according to one embodiment.
Figure 2B:
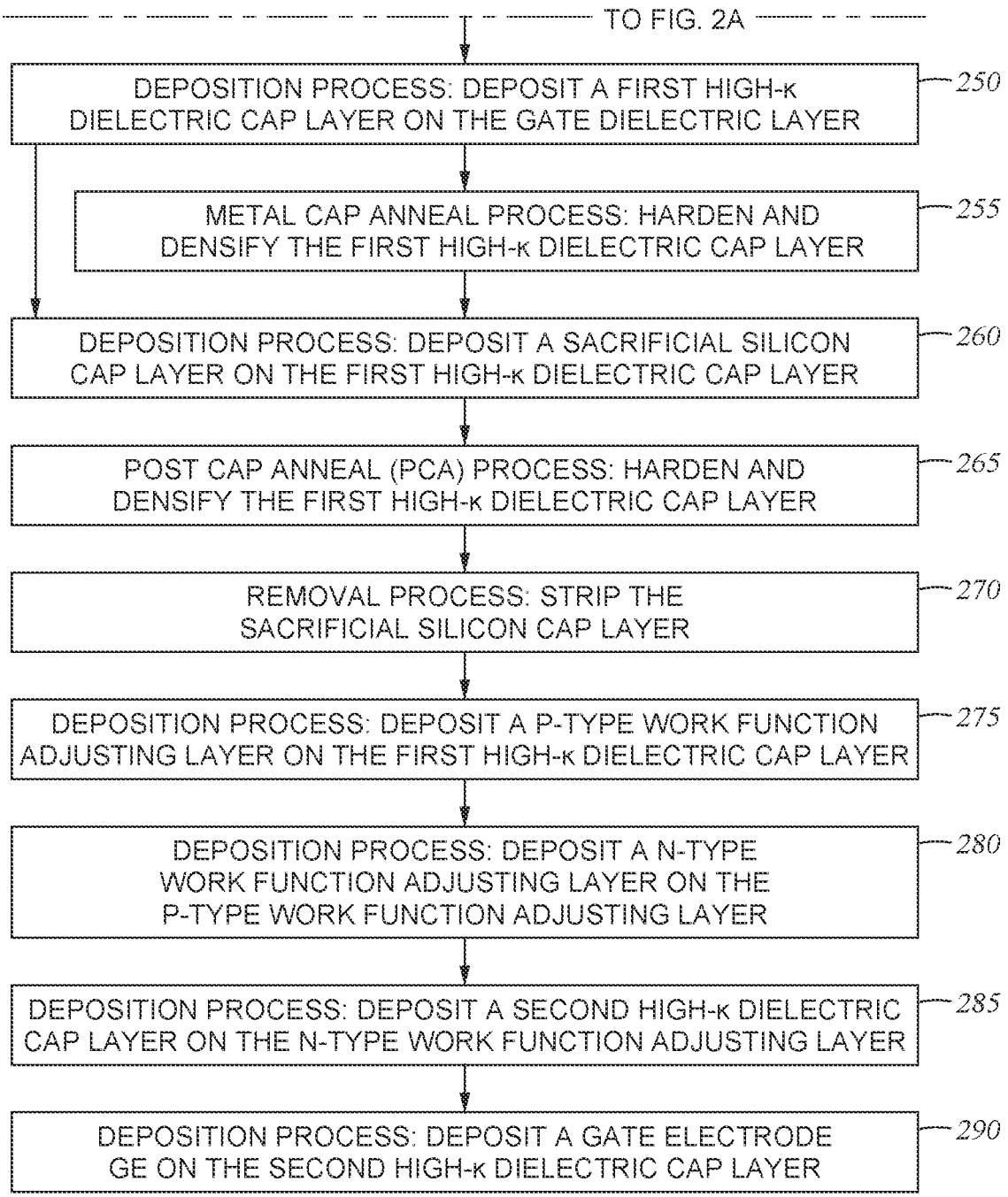
Figure 3A:
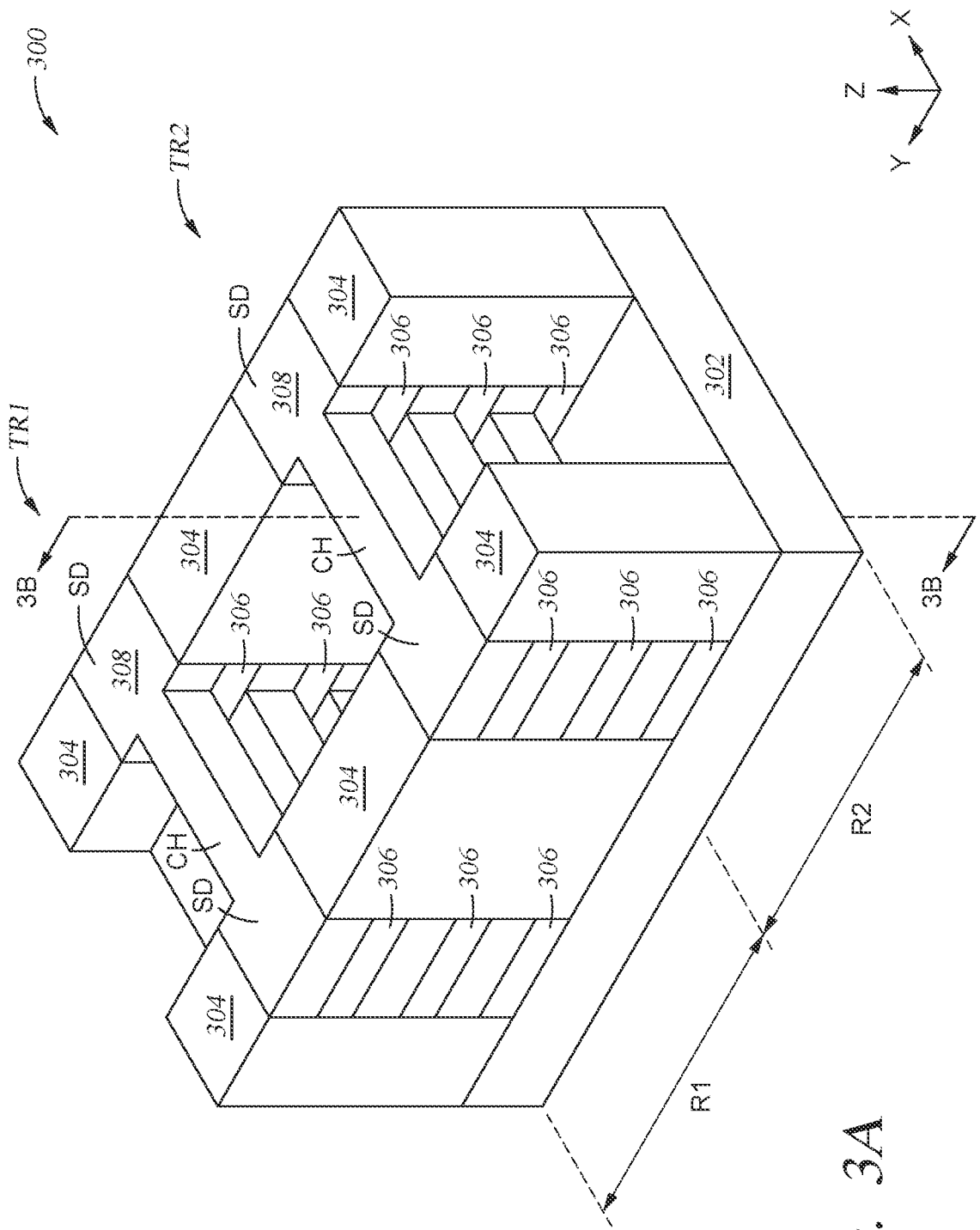
FIG. 3A is an isometric view of a semiconductor structure according to one embodiment.
Figure 3C:
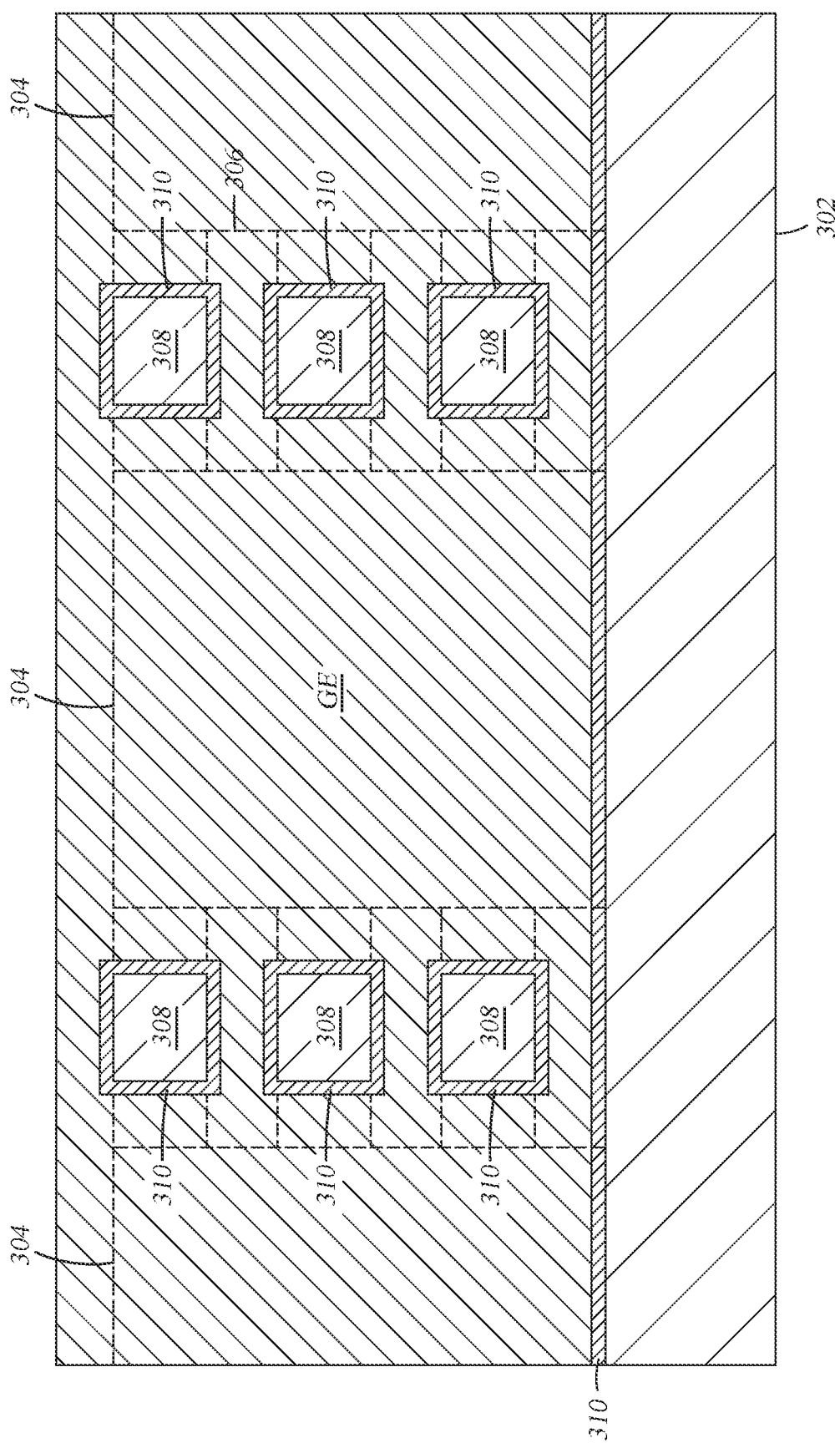

FIGS. 2A and 2B depict a process flow diagram of a method 200 of forming a gate stack structure in a semiconductor structure 300 according to one or more implementations of the present disclosure. FIG. 3A is an isometric view of the semiconductor structure 300. FIGS. 3B and 3C are cross-sectional views of a portion of the semiconductor structure 300 taken along lines B-B' and C-C' of FIG. 3A, respectively. FIG. 3D is an enlarged cross-sectional view of a portion of the semiconductor structure 300 taken along line D-D' of FIG. 3B. FIGS. 4A, 4B, 4C, 4D, 4E, 4F, 4G, and 4H are cross-sectional views of a portion of a gate stack structure formed in the semiconductor structure 300 corresponding to various stages of the method 200. It should be understood that FIGS. 3A, 3B, and 3C illustrate only partial schematic views of the semiconductor structure 300, and the semiconductor structure 300 may contain any number of transistor sections and additional materials having aspects as illustrated in the figures. It should also be noted although the method steps illustrated in FIGS. 2A and 2B are described sequentially, other process sequences that include one or more method steps that have been omitted and/or added, and/or has been rearranged in another desirable order, fall within the scope of the embodiments of the disclosure provided herein.

Referring to FIG. 3A, the semiconductor structure 300 may include a substrate 302 having a first region R1 in which a first gate-all-around field effect transistor (GAA FET) module TR1 is formed and a second region R2 in which a second GAA FET module TR2 is formed. The GAA FET module TR1 and the GAA FET module TR2 are electrically isolated, by an inter-module insulating layer 304, from each other and from other GAA FET modules in the semiconductor structure 300 that are not shown in FIG. 3A.

The term "substrate" as used herein refers to a layer of material that serves as a basis for subsequent processing operations and includes a surface to be cleaned. The substrate 302 may be a silicon based material or any suitable insulating materials or conductive materials as needed. The substrate 302 may include a material such as crystalline silicon (e.g., Si<100> or Si<111>), silicon oxide, strained silicon, silicon germanium, doped or undoped polysilicon, doped or undoped silicon wafers and patterned or non-patterned wafers, silicon on insulator (SOI), carbon doped silicon oxides, silicon nitride, doped silicon, germanium, gallium arsenide, glass, or sapphire. The inter-module insulating layer 304 may be formed of silicon-containing dielectric material such as silicon oxide, silicon nitride, or silicon oxynitride.

In one example, the first region R1 is a high voltage region and the second region R2 is a low voltage region. In another example, the first region R1 is p-type MOSFET (p-MOSFET) region and the second region R2 is an n-type MOSFET (n-MOSFET) region. Each of the GAA FET module TR1 and TR2 may include a channel region CH and source/drain regions SD that are separated by the channel region CH in the X-direction. The source/drain regions SD may be wider in the Y-direction than the channel region CH.

Referring to FIGS. 3A, 3B, and 3C, the source/drain regions SD may include first semiconductor layers 306 and second semiconductor layers 308 that alternately and repeatedly stacked on the substrate 302. The first semiconductor layer 306 is formed of a first material having etch selectivity to a second material of which the second semiconductor layer 308 is formed (i.e., an etch rate of the first material is higher than an etch rate of the second material). The etch selectivity (i.e., a ratio of the etch rate of the first material to the etch rate of the second material) is between about 10:1 to 200:1. Example combinations of the first material and the second material include silicon germanium (SiGe)/silicon (Si), silicon germanium (SiGe)/germanium (Ge), and germanium tin (GeSn)/silicon (Si). Portions of the first semiconductor layers 306 in the source/drain regions SD may be separated in the X-direction by gate electrodes GE, each of which is surrounded by a gate stack 310, formed in the channel region CH. The second semiconductor layer 308 in the channel region CH may serve as nanowires or nanotubes having a width of between several nanometers and several tens of tens nanometers.

The first and second semiconductor layers 306 and 308 may be formed using any suitable deposition technique, such as chemical vapor deposition (CVD), atomic layer deposition (ALD), or physical vapor deposition (PVD), and patterning technique, such as a lithography and etch process.

The first and second semiconductor layer 306 and 308 may each have thickness of between about 6 nm and about 14 nm, for example, about 10 nm.

Referring to FIG. 3D, the gate stack 310 includes an interfacial layer 312, a high-κ gate dielectric layer 314, a first high-κ dielectric cap layer 316, a p-type work function adjusting layer 318, an n-type work function adjusting layer 320, and a second high-κ dielectric cap layer 322 sequentially formed on the second semiconductor layer 308. The gate electrode GE is formed on the second high-κ dielectric cap layer 322.

The method 200 begins with an interface formation process in block 205 to form the interfacial layer 312 on the second semiconductor layer 308, as shown in FIG. 4A. The interface formation process may include a suitable thermal oxidation process, such as an enhanced in-situ steam generation (eISSG) process utilizing nitrous oxide ($N_2O$) gas. The interfacial layer 312 formed in block 205 is a thin amorphous silicon oxide ($SiO_2$) layer, having a thickness of between about 3 Å and about 10 Å, for example, about 5 Å, corresponding to one or more monolayers of silicon oxide. In some embodiments, the interfacial layer 312 may be formed by an in-situ steam generation (ISSG) process utilizing $H_2$ and $O_2$ gases, or a rapid thermal oxidation (RTO) process utilizing $NH_3$ and $O_2$ gases. The interfacial layer 312 may act as a nucleation layer of the high-κ gate dielectric layer 314 to be deposited thereon and improve quality (e.g., such as interface state density, accumulation capacitance, frequency dispersion, and leakage current) of the interface between the second semiconductor layer 308 and the high-κ gate dielectric layer 314. The interface formation process may be performed in a processing chamber, such as the processing chamber 120, 122, 124, 126, 128, or 130 shown in FIG. 1.

In some embodiments, the interface formation process in block 205 is omitted and the interfacial layer 312 is not formed prior to deposition of the high-κ gate dielectric layer 314 on the second semiconductor layer 308. In that case, the interfacial layer 312 is formed by a subsequent thermal oxidation process that thermally oxidizes the second semiconductor layer 308 through the high-κ gate dielectric layer 314 deposited on the second semiconductor layer 308. The interfacial layer 312 formed by the subsequent thermal oxidation process may be thick enough to ensure reliable device characteristics (e.g., such as interface state density, accumulation capacitance, frequency dispersion, and leakage current) and reduce atomic diffusion from the high-κ gate dielectric layer 314 to the second semiconductor layer 308, having a thickness of between about 0.3 nm and about 1 nm, for example, about 0.5 nm.

In block 210, a deposition process is performed to deposit the high-κ gate dielectric layer 314 on the interfacial layer 312, as shown in FIG. 4B. The high-κ gate dielectric layer 314 may be formed of high-κ dielectric material, such as hafnium dioxide ($HfO_2$), zirconium dioxide ($ZrO_2$), ytterbium oxide ($Y_2O_3$), aluminum oxide ($Al_2O_3$), ternary high-κ dielectric film with the third element doped into the existing metal oxide high-κ dielectric host material, such as HfZrO, HfLaOx, HfTiO. The deposition process may include an atomic layer deposition (ALD) process, in which a metal-containing precursor and an oxygen-containing precursor are alternately delivered to the interfacial layer 312. In some embodiments, the metal-containing precursor is purged prior to delivering the oxygen-containing precursor. The metal may be a transition metal, such as hafnium (Hf), zirconium (Zr), or titanium (Ti), a rare-earth metal, such as lanthanum (La), ytterbium (Yb), or yttrium (Y), an alkaline earth metal, such as strontium (Sr), or other metal such as aluminum (Al). For the oxidant, any oxygen-containing precursor may be used that may react with the metal. For example, the oxygen-containing precursor may be or include water, diatomic oxygen, ozone, a hydroxyl-containing precursor or alcohol, nitrogen-and-oxygen-containing precursors, plasma-enhanced oxygen including locally or remotely enhanced oxygen, or any other material including oxygen that may be incorporated with the metal to produce a layer of an oxide of the metal over the interfacial layer 312. In one example, the metal-containing precursor is hafnium tetrachloride ($HfCl_4$) and the oxidant is water ($H_2O$) to form a hafnium dioxide ($HfO_2$) layer. The ALD process may be performed at a temperature of between 200° C. and about 400° C., for example, about 270° C. The high-κ gate dielectric layer 314, as deposited by the ALD process, may be amorphous and have a thickness of between about 10 Å and about 30 Å. The deposition process may be performed in a processing chamber, such as the processing chamber 120, 122, 124, 126, 128, or 130 shown in FIG. 1.

In block 215, an optional post-deposition anneal process is performed to harden and densify the as-deposited high-κ gate dielectric layer 314. Crystallization of the as-deposited amorphous high-κ gate dielectric layer 314 may occur. The post-deposition anneal process may include a thermal anneal process in an inert ambient, such as in a nitrogen ($N_2$) and argon (Ar) ambient, performed in a rapid thermal processing (RTP) chamber, such as RADOX™ chamber, available from Applied Materials, Inc., located in Santa Clara, Calif. The RTP chamber may be any of the processing chambers 120, 122, 124, 126, 128, and 130 shown in FIG. 1. The post deposition anneal process may thermally harden and densify the interfacial layer 312 and the high-κ dielectric layer 314.

The post deposition anneal process may be performed for between about 1 second and about 60 seconds, at a temperature of between about 500° C. and about 800° C., and at a pressure of between about 0.01 Torr and 100 Torr.

In block 220, a plasma nitridation process is performed to insert nitrogen atoms into vacancies and defects in the high-κ gate dielectric layer 314. The plasma nitridation process may be a decoupled plasma nitridation (DPN) process performed in a DPN chamber such as CENTURA® DPN chamber, available from Applied Materials, Inc., located in Santa Clara, Calif. The DPN chamber may be any of the processing chambers 120, 122, 124, 126, 128, and 130 shown in FIG. 1. The plasma nitridation process exposes the high-κ gate dielectric layer 314 to nitrogen plasma, which may allow nitrogen radicals or nitrogen atoms to be incorporated within the high-κ gate dielectric layer 314, throughout the thickness of the high-κ gate dielectric layer 314. During the plasma nitridation process, nitrogen atoms may form metastable bonds with oxygen (O). Gases that may be used in the plasma process include nitrogen-containing gas, such as nitrogen ($N_2$), ammonia ($NH_3$), or mixtures thereof. In one example, the nitrogen gas is ammonia ($NH_3$) mixed with about 3% to about 8% of nitrogen ($N_2$). The plasma nitridation process may not change the thickness of the high-κ gate dielectric layer 314 as a result of the nitrogen incorporation to vacancies and defects in the as-deposited high-κ gate dielectric layer 314.

The nitridation process may be performed for between about 10 seconds and about 300 seconds, at a temperature of between about 0° C. and about 500° C.

In block 225, an optional thermal nitridation process is performed to further insert nitrogen atoms into vacancies and defects in the plasma nitridated high-κ gate dielectric layer 314. The thermal nitridation process may include a thermal anneal process in an ammonia ($NH_3$) ambient, performed in a rapid thermal processing (RTP) chamber, such as RADOX™ chamber, available from Applied Materials, Inc., located in Santa Clara, Calif. The RTP chamber may be any of the processing chambers 120, 122, 124, 126, 128, and 130 shown in FIG. 1.

The thermal nitridation process may be performed for between about 10 seconds and about 300 seconds, at a temperature of between about 700° C. and about 900° C., and at a pressure of between about 10 Torr and 740 Torr.

In block 230, a post-nitridation anneal process is performed to passivate the remaining chemical bonds in the plasma nitridated high-κ gate dielectric layer 314. The post-nitridation anneal process may include a spike thermal anneal process in a nitrogen ($N_2$) and argon (Ar) ambient, performed in a rapid thermal processing (RTP) chamber, such as RADOX™ chamber, available from Applied Materials, Inc., located in Santa Clara, Calif. The RTP chamber may be any of the processing chambers 120, 122, 124, 126, 128, and 130 shown in FIG. 1. The post-nitridation anneal process may passivate metastable nitrogen bonds formed in the plasma nitridation process in block 220 and crystallization of the amorphous high-κ gate dielectric layer 314 may occur.

The spike thermal anneal process may be performed for between about 1 second and about 30 seconds, at a temperature of between about 700° C. and about 850° C., and at a pressure of between about 10 Torr and 740 Torr.

In block 235, a dipole formation process is performed to form a dipole metal layer 402 on the high-κ gate dielectric layer 314, as shown in FIG. 4C. The dipole formation process in block 235 includes a blanket deposition of the dipole metal layer 402 over the entire exposed surface of the high-κ gate dielectric layer 314 in the semiconductor structure 300, and a subsequent lithography and etch process to pattern the dipole metal layer 402 (i.e., to form the dipole metal layer 402 in some regions of the semiconductor structure 300, and not in some other regions of the semiconductor structure 300).

In some embodiments, the dipole metal layer 402 is formed of material containing n-type dopants in high-κ dielectric material, such as hafnium dioxide (HfO$_2$). Suitable n-type dopants include rare-earth metal, such as lanthanum (La), yttrium (Y), and ytterbium (Yb), or any metallic substance having Fermi level higher than that of hafnium (Hf) such as magnesium (Mg). Suitable lanthanum (La)-containing materials include lanthanum oxide (La$_2$O$_3$), lanthanum nitride (LaN), lanthanum (La), and titanium lanthanum nitride (TiLaN). In a subsequent anneal process, n-type dopant species from the dipole metal layer 402 are diffused and incorporated into the underlying high-κ gate dielectric layer 314, which lowers the threshold voltage V$_t$ in an n-MOSFET. An amount of n-type dopant species determines a change in the threshold voltage V$_t$. For example, incorporation of lanthanum (La) species of between about 1 atomic % and about 5 atomic % in the high-κ gate dielectric layer 314 changes the threshold voltage V$_t$ by about 10 eV.

In some other embodiments, the dipole metal layer 402 is formed of material containing p-type dopants in high-κ dielectric material, such as hafnium dioxide (HfO$_2$). Suitable p-type dopants include aluminum (Al), niobium (Nb), Tantalum (Ta), or any metallic substance having Fermi level lower than that of hafnium (Hf). Suitable aluminum (Al)-containing materials include aluminum oxide (Al$_2$O$_3$) Suitable niobium (Nb)-containing materials include niobium nitride (NbN), niobium oxide (NbOx), and titanium niobium nitride (TiNbN). In a subsequent anneal process, p-dopant species are diffused and incorporated into the underlying high-κ gate dielectric layer 314, which lowers the threshold voltage V$_t$ in a p-MOSFET. An amount of p-type dopants determines a change in the threshold voltage V$_t$. For example, incorporation of aluminum (Al) species of between about 1 atomic % and about 5 atomic % in the high-κ gate dielectric layer 314 changes the threshold voltage V$_t$ by about 80 eV. Incorporation of niobium (Nb) species of between about 1 atomic % and about 5 atomic % in the high-κ gate dielectric layer 314 changes the threshold voltage V$_t$ by about 120 eV.

The blanket deposition process may include an atomic layer deposition (ALD) process. The ALD process may be performed at a temperature of between 200° C. and about 400° C., for example, about 300° C. The dipole metal layer 402, as deposited by the ALD process, may have a thickness of between about 3 Å and about 20 Å, for example, about 10 Å. The deposition process may be performed in a processing chamber, such as the processing chamber 120, 122, 124, 126, 128, or 130 shown in FIG. 1.

In block 240, an anneal process is performed to cause the dopants species (lanthanum (La), aluminum (Al), or niobium (Nb)) to diffuse into the underlying high-κ gate dielectric layer 314. The anneal process in block 240 may include a thermal anneal process in an inert ambient, such as in a nitrogen (N$_2$) and argon (Ar) ambient, performed in a rapid thermal processing (RTP) chamber, such as RADOX™ chamber, available from Applied Materials, Inc., located in Santa Clara, Calif. The RTP chamber may be any of the processing chambers 120, 122, 124, 126, 128, and 130 shown in FIG. 1.

The anneal process in block 240 may be performed for between about 1 second and about 30 seconds, at a temperature of between about 600° C. and about 1000° C., for example, about 900° C. and at a pressure of between about 0.1 Torr and 100 Torr.

In block 245, a removal process is performed to strip the dipole metal layer 402. The removal process may include a dry plasma etch process.

In block 250, a deposition process is performed to deposit the first high-κ dielectric cap layer 316 on the gate dielectric layer 314 of the semiconductor structure 300, as shown in FIG. 4D. The first high-κ dielectric cap layer 316 may be formed of metal nitride material including titanium (Ti) or tantalum (Ta), such as TiN, or TaN. The first high-κ dielectric cap layer 316 is used as a protective layer for the first high-κ dielectric cap layer 316 during the subsequent patterning and etch process. The deposition process in block 250 may include an atomic layer deposition (ALD) process, in which the metal-containing precursor including titanium (Ti) or tantalum (Ta), the nitrogen-containing precursor, and a dopant-containing precursor are delivered to a surface of the gate dielectric layer 314. Examples of the metal-containing precursor including titanium (Ti) or tantalum (Ta), and examples of the nitrogen-containing precursor are ammonia (NH$_3$), diazene (N$_2$H$_2$), and hydrazine (N$_2$H$_4$).

The ALD process in block 250 may be performed at a temperature of between about 200° C. and about 700° C., for example, between about 300° C. and about 600° C. The first high-κ dielectric cap layer 316, as deposited by the ALD process in block 250, may be amorphous and have a thickness of between about 2 Å and about 200 Å, for example, between about 10 Å and about 15 Å. The deposition process may be performed in a processing chamber, such as the processing chamber 120, 122, 124, 126, 128, or 130 shown in FIG. 1.

In block 255, an optional metal cap anneal process is performed to harden and densify the as-deposited first high-κ dielectric cap layer 316. Crystallization of the as-deposited first high-κ dielectric cap layer 316 may occur. The optional metal cap anneal process in block 255 may include a thermal anneal process in an inert ambient, such as in a nitrogen (N$_2$) and argon (Ar) ambient, performed in a rapid thermal processing (RTP) chamber, such as RADOX™ chamber, available from Applied Materials, Inc., located in Santa Clara, Calif. The RTP chamber may be any of the processing chambers 120, 122, 124, 126, 128, and 130 shown in FIG. 1.

The optional metal cap anneal process in block 255 may be performed for between about 1 second and about 10 seconds, at a temperature of between about 700° C. and about 850° C. and at a pressure of between about 0.1 Torr and 100 Torr.

Figures 4E, 4F, 4G, 4H:
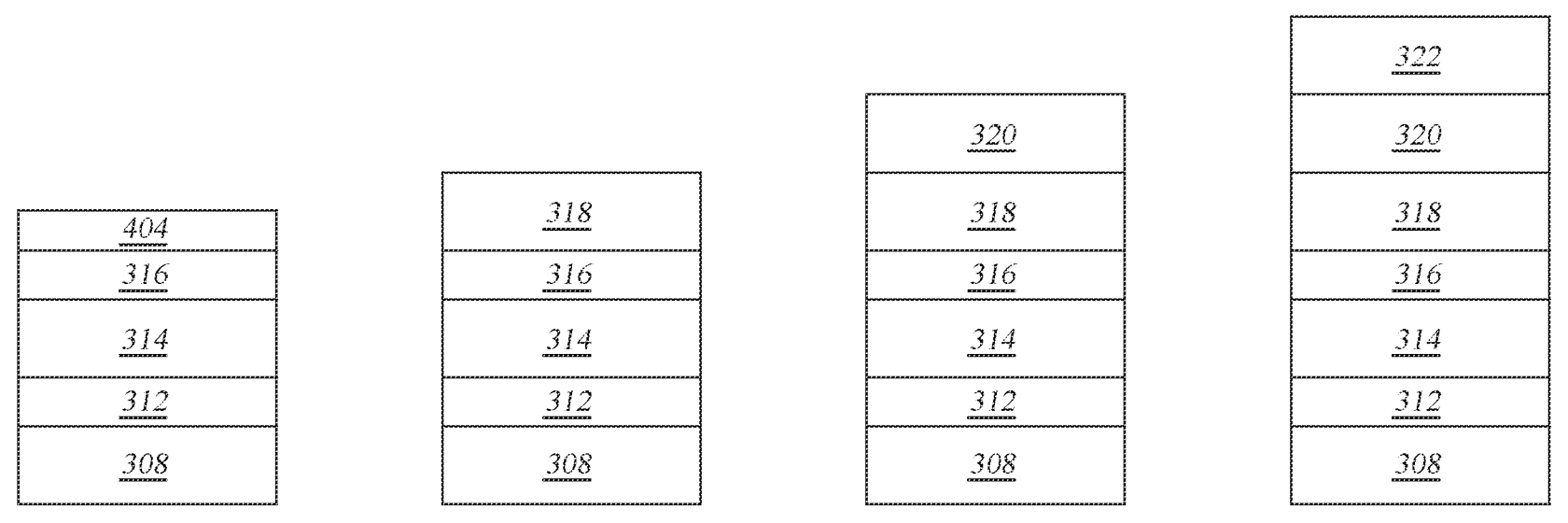

In block 260, a deposition process is performed to deposit a sacrificial silicon cap layer 404 on the first high-κ dielectric cap layer 316, as shown in FIG. 4E. The sacrificial silicon cap layer 404 may physically and chemically protect the underlying high-κ gate dielectric layer 314 and the first high-κ dielectric cap layer 316 during a subsequent anneal process in block 265 The sacrificial silicon cap layer 404 is formed of amorphous silicon, such as hydrogenated amorphous silicon (a-Si:H). Amorphous silicon may provide less diffusion of atoms as compared to polycrystalline silicon which include grain boundaries leading path for diffusion. The deposition process in block 260 may be an atomic layer deposition (ALD) process or a chemical vapor deposition (CVD) process, in which the semiconductor structure 300 having the first high-κ dielectric cap layer 316 formed thereon is exposed to a silicon precursor. Examples of the silicon precursors are poly-silanes (Si$_x$H$_y$). For example, poly-silanes include disilane (Si$_2$H$_6$), trisilane (Si$_3$H$_8$), tetrasilane (Si$_4$H$_{10}$), isotetrasilane, neopentasilane (Si$_5$H$_{12}$), cyclopentasilane (Si$_5$H$_{10}$), hexasilane (C$_6$H$_{14}$), cyclohexasilane (Si$_6$H$_{12}$) or, in general, Si$_x$H$_y$ with x=2 or more, and combinations thereof.

The sacrificial silicon cap layer 404 may have a thickness of between about 30 Å and about 50 Å. The deposition process in block 260 may be performed in a processing chamber, such as the processing chamber 120, 122, 124, 126, 128, or 130 shown in FIG. 1.

In block 265, a post cap anneal (PCA) process is performed to harden and densify the first high-κ dielectric cap layer 316. Crystallization of the as-deposited first high-κ dielectric cap layer 316 and the as-deposited sacrificial silicon cap layer 404 may occur. The PCA process in block 265 may include a thermal anneal process in an inert ambient, such as in a nitrogen ($N_2$) and argon (Ar) ambient, performed in a rapid thermal processing (RTP) chamber, such as RADOX™ chamber, available from Applied Materials, Inc., located in Santa Clara, Calif. The RTP chamber may be any of the processing chambers 120, 122, 124, 126, 128, and 130 shown in FIG. 1.

The PCA process in block 265 may be performed for between about 1 second and about 10 seconds, at a temperature of between about 900° C. and about 1000° C., for example, about 900° C. and at a pressure of between about 0.1 Torr and 100 Torr.

In block 270, a removal process is performed to strip the sacrificial silicon cap layer 404. The removal process may include a dry plasma etch process.

In block 275, a deposition process is performed to deposit a p-type work function adjusting layer 318 on the hardened and densified first high-κ dielectric cap layer 316, as shown in FIG. 4F. The p-type work function adjusting layer 318, in conjunction with the high-κ gate dielectric layer 314, acts as an effective gate electrode in a p-type MOSFET region.

The p-type work function adjusting layer 318 may be formed of p-doped conductive material, titanium nitride (TiN), titanium silicon nitride (TiSiN), tantalum silicon nitride (TaSiN), molybdenum nitride (MoN), tungsten nitride ($W_3N_2$), niobium nitride (NbN), molybdenum niobium nitride (MoNbN), and titanium niobium nitride (TiNbN). In some embodiments, the p-type work function adjusting layer 318 may have a doping amount of between about 1 atomic percent and about 20 atomic percent, for example, about 10 atomic percent. Thickness of the p-type work function adjusting layer 318 determines a change in the threshold voltage $V_t$. For example, a change in thickness of the p-type work function adjusting layer 318 changes the threshold voltage $V_t$ by about 80 eV. The overall thickness of the p-type work function adjusting layer 318 may be between about 5 Å and about 30 Å, for example, about 10 Å.

The deposition process may include an atomic layer deposition (ALD) process, in which a metal-containing precursor and a nitrogen-containing precursor such as ammonia ($NH_3$) are alternately delivered to the exposed surface of the semiconductor structure 300. In some embodiments, the metal-containing precursor is purged prior to delivering the nitrogen-containing precursor. This sequence is repeated until a desired thickness is reached. The metal may be titanium (Ti), molybdenum (Mo), niobium (Nb), tantalum (Ta), or tungsten (W). The ALD process may be performed at a temperature of between about 200° C. and about 400° C., for example, about 300° C. The deposition process may be performed in a processing chamber, such as the processing chamber 120, 122, 124, 126, 128, or 130 shown in FIG. 1.

In block 280, a deposition process is performed to deposit the n-type work function adjusting layer 320 on the p-type work function adjusting layer 318, as shown in FIG. 4G. The n-type work function adjusting layer 320, in conjunction with the high-κ gate dielectric layer 314, acts as an effective gate electrode in a n-type MOSFET region.

The n-type work function adjusting layer 320 may be formed of n-doped conductive material, such as titanium aluminum carbide ($Ti_3AlC_2$), zinc nitride ($Zn_3N_2$), vanadium nitride (VN), magnesium nitride ($Mg_3N_2$), yttrium nitride (YN), strontium nitride ($Sr_3N_2$), or any metallic species with average work function higher than the mid-gap of silicon. In some embodiments, the n-type work function adjusting layer 320 may have a doping amount of between about 1 atomic percent and about 20 atomic percent, for example, about 10 atomic percent. Thickness of the n-type work function adjusting layer 320 determines a change in the threshold voltage $V_t$. For example, a change in thickness of the n-type work function adjusting layer 320 changes the threshold voltage $V_t$ by about 80 eV. The overall thickness of the n-type work function adjusting layer 320 may be between about 5 Å and about 30 Å, for example, about 10 Å.

The deposition process may include an atomic layer deposition (ALD) process, in which a metal-containing precursor and a nitrogen-containing precursor such as ammonia ($NH_3$) are alternately delivered to the exposed surface of the semiconductor structure 300. In some embodiments, the metal-containing precursor is purged prior to delivering the nitrogen-containing precursor. The metal may be titanium (Ti), aluminum (Al), zinc (Zn), vanadium (V), magnesium (Mg), yttrium (Y), or strontium (Sr). The ALD process may be performed at a temperature of between about 200° C. and about 400° C., for example, about 300° C. The deposition process may be performed in a processing chamber, such as the processing chamber 120, 122, 124, 126, 128, or 130 shown in FIG. 1.

In block 285, a formation process is performed to form the second high-κ dielectric cap layer 322 on the n-type work function adjusting layer 320, as shown in FIG. 4H. The formation process in block 285 is substantially the same as the deposition process in block 250, the metal cap anneal process in block 255, the deposition process in block 260, the post cap anneal (PCA) process in block 265, and the removal process in 270.

In block 290, a deposition process is performed to deposit the gate electrode GE on the second high-κ dielectric cap layer 322, as shown in FIG. 3D. The gate electrode GE may be formed of metal such as tungsten (W), or cobalt (Co). The gate electrode GE may be p-type doped or n-type doped. The deposition process in block 290 may include a chemical vapor deposition (CVD) process using a tungsten-containing precursor, such as $WF_6$, or a cobalt-containing precursor.

The embodiments described herein provide systems and methods for forming gate stack structures in gate-all-around (GAA) FET with modulated threshold voltages $V_t$. A gate stack structure includes a gate electric layer formed of a high-κ dielectric material (e.g., hafnium oxide ($HfO_2$)) and a gate electrode formed of a metal layer (e.g., titanium (Ti), tantalum (Ta), tungsten (W)) or a conductive compound layer (e.g., titanium nitride (TiN), tantalum nitride (TaN)). The threshold voltages $V_t$ are controllably modulated by inducing a dipole layer in the high-κ gate dielectric, adding a work function adjusting layer to the gate electrode and adjusting thickness thereof, or combination thereof.

The gate stack structure described herein can be advantageously used in any metal gate applications and/or any barrier applications in MOSFETs, dynamic random-access memory (DRAM), and flash memories.

While the foregoing is directed to embodiments of the present disclosure, other and further embodiments of the disclosure may be devised without departing from the basic scope thereof, and the scope thereof is determined by the claims that follow.

The invention claimed is:

1. A method of forming a gate stack structure, the method comprising:
   forming a dipole metal layer on a high-gate dielectric layer on a semiconductor structure formed on a substrate;
   annealing the dipole metal layer; and
   removing the dipole metal layer, wherein
   the dipole metal layer comprises dopants in the high-K gate dielectric layer.

2. The method of claim 1, wherein the forming of the dipole metal layer comprises:
   blanket depositing the dipole metal layer on the semiconductor structure; and
   patterning the dipole metal layer.

3. The method of claim 1, wherein
   the high-K gate dielectric layer comprises hafnium oxide ($HfO_2$).

4. The method of claim 3, wherein
   the dipole metal layer comprises lanthanum (La).

5. The method of claim 3, wherein
   the dipole metal layer comprises aluminum (Al).

6. The method of claim 3, wherein
   the dipole metal layer comprises niobium (Nb).

7. The method of claim 1, wherein
   the dipole metal layer has a thickness of between 3 Å and 20 Å.

8. A method of forming a gate stack structure, the method comprising:
   forming a p-type work function adjusting layer on a high-k gate dielectric layer on a semiconductor structure formed on a substrate;
   forming an n-type work function adjusting layer on the high-K gate dielectric layer; and
   forming a metal gate electrode on the p-type work function adjusting layer and the n-type work function adjusting layer, wherein
   the p-type work function adjusting layer comprises p-doped conductive material, and
   the n-type work function adjusting layer comprises n-doped conductive material.

9. The method of claim 8, wherein
   the metal gate electrode comprises tungsten (W).

10. The method of claim 8, wherein
    the p-type work function adjusting layer has a thickness of between 5 Å and 30 Å.

11. The method of claim 8, wherein
    the n-type work function adjusting layer has a thickness of between 5 Å and 30 Å.

12. A method of forming a gate stack structure on a semiconductor structure, the method comprising:
    forming an interfacial layer on a semiconductor structure;
    forming a high-K gate dielectric layer on the interfacial layer;
    forming a dipole metal layer comprising dopants in the high-gate dielectric layer on the high-K gate dielectric layer;
    annealing the dipole metal layer;
    removing the dipole metal layer;
    forming a first high-K dielectric cap layer on the high-K gate dielectric layer;
    forming a p-type work function adjusting layer on the high-K gate dielectric layer;
    forming an n-type work function adjusting layer on the high-K gate dielectric layer;
    forming a second high-K dielectric cap layer on the p-type work function adjusting layer and the n-type work function adjusting layer; and
    forming a metal gate electrode on the second high-K dielectric cap layer, wherein
    the p-type work function adjusting layer comprises p-doped conductive material, and
    the n-type work function adjusting layer comprises n-doped conductive material.

13. The method of claim 12, wherein the forming of the dipole metal layer comprises:
    blanket depositing the dipole metal layer on the high-K gate dielectric layer; and
    patterning the dipole metal layer.

14. The method of claim 12, wherein
    the high-K gate dielectric layer comprises hafnium oxide ($HfO_2$).

15. The method of claim 14, wherein
    the dipole metal layer comprises lanthanum (La).

16. The method of claim 14, wherein
    the dipole metal layer comprises aluminum (Al) or niobium (Nb).

17. The method of claim 12, wherein
    the metal gate electrode comprises tungsten (W).

18. The method of claim 17, wherein
    the p-type work function adjusting layer has a thickness of between 5 Å and 30 Å.

19. The method of claim 17, wherein
    the n-type work function adjusting layer comprises n-doped conductive material and has a thickness of between 35 Å and 30 Å.

20. The method of claim 12, wherein
    the first high-K dielectric cap layer and the second high-K dielectric cap layer each comprise titanium nitride (TIN).

* * * * *